(12) United States Patent
Takeshima et al.

(10) Patent No.: US 6,727,187 B2
(45) Date of Patent: Apr. 27, 2004

(54) FABRICATION METHOD FOR SEMICONDUCTOR DEVICE

(75) Inventors: Yutaka Takeshima, Ome (JP);
Michimasa Funabashi, Hachiouji (JP);
Kenji Tanaka, Tachikawa (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 32 days.

(21) Appl. No.: 09/828,957

(22) Filed: Apr. 10, 2001

(65) Prior Publication Data

US 2001/0039116 A1 Nov. 8, 2001

(30) Foreign Application Priority Data

Apr. 27, 2000 (JP) .......................... 2000-127269
Jan. 15, 2001 (JP) .......................... 2001-006184

(51) Int. Cl.[7] ................... H01L 21/302; H01L 21/00
(52) U.S. Cl. .................................. 438/745; 438/906
(58) Field of Search .......................... 438/197, 745, 438/906

(56) References Cited

U.S. PATENT DOCUMENTS

| 5,021,842 A | * | 6/1991 | Koyanagi | 357/23.6 |
| 5,278,430 A | * | 1/1994 | Kakumu | 257/77 |
| 5,468,686 A | * | 11/1995 | Kawamoto | 437/229 |
| 5,904,574 A | * | 5/1999 | Nishijima | 438/758 |
| 6,218,221 B1 | * | 4/2001 | Sah | 438/158 |
| 6,417,052 B1 | * | 7/2002 | Tsujikawa et al. | 438/287 |

FOREIGN PATENT DOCUMENTS

| JP | 03208899 | 9/1991 |
| JP | 03228327 | 10/1991 |
| JP | 05166777 | 7/1993 |
| JP | 08031781 | 2/1996 |
| JP | 08264499 | 10/1996 |

OTHER PUBLICATIONS

Chang, CY, ed., ULSI Technology, McGraw Hill, 1996, pp. 60–64 and 100–101.
ULSI Technology Internationa Editions 1996; C. Y. Chang, T. S. Chao; Chapter 2; Wafer–Cleaning Technology; pp. 60–104.

* cited by examiner

Primary Examiner—Amir Zarabian
Assistant Examiner—Pamela E Perkins
(74) Attorney, Agent, or Firm—Antonelli, Terry, Stout & Kraus, LLP

(57) ABSTRACT

For providing a cleaning technique capable of removing metal contamination at a low temperature and in a short period of time, an aqueous solution containing 0.1 to 15% by weight of hydrochloric acid, 0.01 to 0.3% by weight of hydrofluoric acid and 0.1 to 15% by weight of hydrogen peroxide is used as a cleaning solution for cleaning a semiconductor substrate after forming a gate electrode of a polymetal structure on the semiconductor substrate.

22 Claims, 11 Drawing Sheets

CLEANING TIME AND METAL
CONTAMINATION REMOVAL EFFICIENCY

EFFECT OF HCl/HF RATIO ON
OXIDE FILM ETCHING RATE

FABRICATION METHOD FOR SEMICONDUCTOR DEVICE

BACKGROUND OF THE INVENTION

The present invention is directed to a fabrication technique for use in the manufacture of a semiconductor device; and, more in particular, the invention relates to a technique which is effective in a wet cleaning treatment performed in the fabrication of a semiconductor device.

In the fabrication of a semiconductor device, a wet cleaning technique proposed by the RCA company in the USA (so-called RCA cleaning) has been used generally as a method of removing contaminant materials, such as obstacles or metals which are deposited or which remain on the surface of silicon substrates.

RCA cleaning is a cleaning technique comprising, in combination, (1) a dipping treatment using a mixed solution of ammonium hydroxide ($NH_4OH$)+hydrogen peroxide ($H_2O_2$)+water (referred to as SC-1 solution or APM solution) at 80° C. for about 10 to 20 min, (2) a dipping treatment using a hydrofluoric acid (HF) at room temperature for several tens of seconds and (3) a dipping treatment using a mixed solution including hydrochloric acid (HCl)+hydrogen peroxide+water (referred to as SC-2 solution or HPM solution) at 80° C. for about 10 min. Among the cleaning solutions described above, the SC-1 solution is used mainly for removing obstacles and the SC-2 solution is used mainly for removing metal contaminants. Further, hydrofluoric acid is used for removing silicon oxide films, which become unnecessary in the course of the steps of the fabrication method, or spontaneous oxide films.

Metal contamination on the surface of the silicon substrates tends to diffuse due to the subsequent heat treatment, such as by oxidation, into gate insulation films or substrates, so as to bring about degradation of the device characteristics, such as deterioration of the insulation withstand voltage for the gate insulation films, fluctuation of gate insulation film/substrate interface energy level and pn-junction destruction. Particularly, in recent years in which integrated circuits are constituted by refined devices, LSIs suffer from degradation of the device characteristics due to metals even when present in an extremely small amount, on the surface of the silicon substrates. Therefore, in view of the fabrication yield of the LSI, how to remove metal contamination effectively in the cleaning step is a predominant consideration.

The SC-2 solution (mixed solution of hydrochloric acid+hydrogen peroxide+water) used for removing metal contamination in the RCA cleaning method described above has no etching function by nature, so that it is difficult to effectively remove metal contamination, such as Cu (copper) taken into the surface of the silicon substrates. Accordingly, various improved SC-2 solutions have been proposed with an aim of enhancing the metal removing function of the SC-2 solution. The textbook of Chan & Sze (Chang & Sze, "ULSI Technology", McGRAW-Hill, 1996, p 60–104) and literatures cited therein give detailed explanations of such SC-2 solutions.

Japanese Laid-open Patent Application Hei 3(1991)-208899 discloses a technique for removing metal contaminants and fine particle contaminants together in the cleaning of wafers by using an aqueous solution containing 0.1% or more of hydrochloric acid, 0.05 to 10% of hydrofluoric acid and 0.05 to 10% by weight of hydrogen peroxide heated to 60° C. to 80° C.

Japanese Laid-open Patent Application Hei 8(1996)-031781 discloses a technique for removing metal contamination on the wafer surface and contaminants in surface oxide films by using an aqueous solution containing 0.17% of hydrochloric acid, 0.25% of hydrofluoric acid and 0.1 to 0.2% of hydrogen peroxide.

Japanese Laid-open Patent Application Hei 8-264499 discloses a technique for removing metals on a wafer surface, particularly, Cu (copper), by using an aqueous solution at 60° C. or lower, containing 0.5–3 mol/L of hydrochloric acid, 0.3 to 2.5 mol/L of 0.25% hydrogen peroxide and 0.01 to 0.3% by weight of hydrofluoric acid.

Japanese Laid-open Patent Application Hei 3(1991)-228327 discloses a technique for removing heavy metal contamination by dipping wafers in an aqueous solution at a normal temperature, the solution containing 3% of hydrochloric acid, 0.4% of hydrofluoric acid and 5% of hydrogen peroxide.

Japanese Laid-open Patent Application Hei 5(1993)-166777 discloses a technique for removing cross contamination with a smaller number of steps by using an aqueous solution containing 0.7% of hydrochloric acid, 0.5% of hydrofluoric acid and 0.15% of hydrogen peroxide.

SUMMARY OF THE INVENTION

The present inventors have made a study of the problems caused in a case of applying a SC-2 solution to cleaning steps for an LSI fabricated according to the design rule of 0.18 $\mu$m or less.

As has been described above, for removing metal contamination on the surface of silicon substrates by using an SC-2 solution (hydrochloric acid+hydrogen peroxide+water), since the SC-2 solution has to be kept at a high temperature of about 80° C., there exists a problem in that the cleaning apparatus consumes a great amount of electric power. Further, there is also a problem in that the composition of the cleaning solution fluctuates greatly because of high temperature treatment, leading to an increase in the frequency of exchanging the chemical solution. Furthermore, there is also a problem in that the space required for installing the cleaning apparatus is increased since a heating facility is necessary.

In the recent situation concerning wafer-by-wafer treatment, along with the increasing size of wafers, a short time treatment has been required for the cleaning step from the view point of improving the throughput. However, the SC-2 solution requiring a high temperature and long time treatment hinders wafer-by-wafer treatment in the cleaning steps.

The effect of metal contamination has become conspicuous along with refinement of the devices, and an extremely low metal contamination level is required for deep sub-micron devices. However, since the SC-2 solution used for removing the metal contamination has no etching function, it can not effectively remove metal contamination taken into the substrate surface or the gate insulation film surface. On the other hand, various kinds of improved SC-2 solutions in which hydrofluoric acids are added to the SC-2 solution exhibit an improved etching function for a silicon substrate or a silicon oxide film by scraping the silicon substrate or the silicon oxide film to simultaneously remove metals deposited on the surfaces thereof; however, they tend to scrape the silicon substrate or the silicon oxide film excessively so as to possibly deteriorate the device characteristics.

Particularly, as a countermeasure for compensating gate delay along with refinement of gate electrodes in a deep sub-micron MISFET, metal material such as W (tungsten) is introduced into the gate electrode materials. Therefore, while there has been a demand for a cleaning technique capable of efficiently removing metal contamination after the fabrication of the gate electrode, when cleaning at a high temperature and for a long time using a SC-2 solution containing hydrogen peroxide for ionizing W, the W film constituting the gate electrode is scraped and eliminated. Further, when an improved SC-2 solution containing hydrofluoric acid as described above is used, since hydrofluoric acid etches the gate oxide film at the lower portion of the gate electrode side wall, this may possibly deteriorate the characteristics of the device.

An object of the invention is to provide a technique which is capable of reducing the electric power consumption in a cleaning apparatus.

A further object of this invention is to provide a technique which is capable of improving the cleaning performance in the fabrication of a semiconductor device.

A still further object of this invention is to provide a technique which is capable of reducing the frequency at which the chemical solution needs to be replaced during cleaning.

Another object of this invention is to provide a technique which is capable of decreasing the space needed for installing a cleaning apparatus in the fabrication of a semiconductor device.

Still another object of this invention is to provide a technique which is capable of reducing the cost of the cleaning apparatus.

Yet another object of this invention is to provide a technique which is capable of preventing elimination of a gate electrode during cleaning after patterning a polymetal gate electrode.

A further object of this invention is to provide a technique which is capable of efficiently removing metal contamination with no unnecessary etching or a silicon substrate or a silicon oxide film.

The foregoing and other objects, as well as novel features of this invention, will become apparent from the descriptions provided in the present specification and from the accompanying drawings.

Outlines of typical aspects and features of the invention disclosed in the present application will be briefly explained below.

This invention uses, as a cleaning solution for removing metal contamination on the surface of a semiconductor wafer, an aqueous solution containing 0.1 to 15% by weight of hydrochloric acid, 0.01 to 0.3% by weight of hydrofluoric acid and 0.1 to 15% by weight of hydrogen peroxide. The concentration of the hydrochloric acid, hydrofluoric acid and hydrogen peroxide is, preferably, 0.3 to 5% by weight, 0.02 to 0.2% by weight and 0.3 to 5% by weight, respectively, and, more preferably, 0.5 to 3% by weight, 0.03 to 0.1% by weight and 0.5 to 3% by weight, respectively.

Further, the ratio of hydrochloric acid to hydrofluoric acid contained in the aqueous solution is hydrochloric acid: hydrofluoric acid=5 to 1500:1 (weight ratio), more preferably, hydrochloric acid: hydrofluoric acid=5 to 1000 1 (weight ratio) and, further preferably, hydrochloric acid hydrofluoric acid=10 to 30:1 (weight ratio).

Further, outlines of other features of the invention as described in the present application are paraphrased in the following.

1. A method of fabricating a semiconductor device includes the steps of:
    (a) forming a first film pattern containing a film of a refractory metal base (usually tungsten at high purity, alloy with other metal such as a refractory metal, and those with addition of other additives) on the surface of a silicon base usually impurity doped silicon single crystal region, and other such as silicon germanium alloy, silicon germanium carbon alloy regions) on a first main surface of a wafer,
    (b) acting a first alkaline cleaning solution on the first main surface of the wafer formed with the first film pattern,
    (c) acting a second acidic cleaning solution containing hydrofluoric acid, hydrochloric acid, hydrogen peroxide and water on the first main surface of the wafer formed with the first film pattern and
    (d) applying a high temperature heat treatment at a temperature exceeding 600° C., after completing both of the step (b) and step (c) to the wafer without cleaning by a third cleaning solution containing hydrofluoric acid different in the composition from the second cleaning solution.

2. In the fabrication method for a semiconductor device according to paragraph (1) above, the film of the refractory metal base is a film including tungsten or molybdenum as a main constituent ingredient.

3. In the fabrication method for a semiconductor device according to paragraph (2) above, the first cleaning solution contains ammonium hydroxide, hydrogen peroxide and water.

BRIEF DESCRIPTION OF THE DRAWINGS

These and other objects, as well as novel features of this invention, will become apparent by reading the descriptions of various embodiments in the present specification and from the appended drawings, wherein.

DETAILED DESCRIPTION OF THE PREFERRED EMBODIMENT

Figure 1:
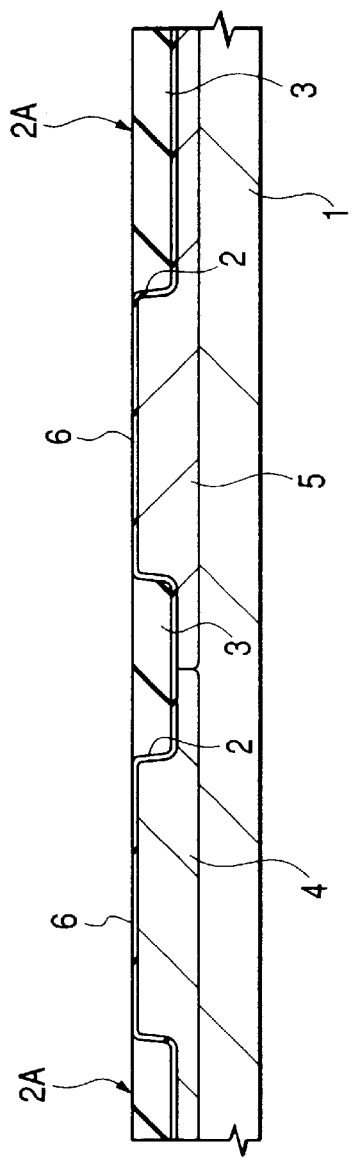
FIG. 1 is a cross sectional view of a main portion of a semiconductor device during a step in the fabrication of a preferred embodiment according to this invention.

Before explaining the preferred embodiments of this invention, fundamental meanings of terms used in the present specification will be described below.

"Semiconductor device" in this specification means not only those prepared on single crystal silicon substrates, but also includes those prepared on other substrates, such as a SOI (Silicon On Insulator) substrate or substrates or fabrication of TFT (Thin Film Transistor) liquid crystal, unless otherwise specified.

Further, "semiconductor wafer (semiconductor substrate)" means silicon and other semiconductor single crystal substrates (generally in substantially planer circular shape), sapphire substrates, glass substrates, as well as other insulative or semi-insulative or semiconductor substrates and composite substrates thereof used for the fabrication of a semiconductor device.

Further, the expression "including A" used for materials (solid, solution, gas) generally means not only pure materials, but also those compounds, mixed crystals, mixtures, composites bodies, as well as those containing other additives and impurities, within a range in which the fundamental properties do not change greatly. For example, it will be apparent that "silicon wafer" includes note only wafers entirely consisting of silicon single crystals, but also generally includes those containing other materials in a region in the inside or on the surface, for example, an $Si_XGe_Y$ channel region and SOI substrates, as described above.

The preferred embodiments are conveniently explained as being optionally divided into plural sections or embodiments; however, unless otherwise specified, they are not independent of leach other, but are in such a relation that one constitutes, partially or wholly, modified embodiments, details, and supplemental explanations of the other.

Further, when the numbers of constituents (including number, numerical value, amount, range and the like) are referred to in the following embodiments, they are not restricted to particular numbers, but may be more than or less than the particular numbers unless otherwise specified, except for the case where they are apparently restricted to the particular numbers.

Furthermore, in the following embodiments, the constituent factors (also including constituent steps) are not always essential unless otherwise specified or considered apparently essential in view of principle. In the same manner, when a shape and a positional relation for the constituent factors are referred to in the description of the following embodiments, they also include those substantially closer to or similar with the shape and the like unless otherwise specified, except for the case where they are apparently considered to be excluded in view of principle. This is also applicable to the numeral value and the range described above.

Further, throughout the drawings for illustrating the embodiments, those elements having identical functions carry the same reference numerals, for which duplicate explanations will be omitted.

Further, in this embodiment, a MOS FET (Metal Oxide Semiconductor Field Effect Transistor) exemplifying a field effect transistor is simply referred to as MOS, a p-channel type MOS FET is simply referred to as PMOS and a n-channel MOS FET is simply referred to as NMOS. While MOS FET includes MIS FET (Metal Insulator Semiconductor Field Effect Transistor), they are referred to using MOS FET as a representative term.

Further, a treatment, such as a plurality kinds of cleaning, will be explained as being practiced in a plurality of places, chambers or tanks optionally, but this does not exclude plural kinds of treatment conducted in one identical place or the like. The description embodiment also includes a case of using a treatment section in common.

In the subsequent embodiments, the wafer cleaning temperature is not a temperature of the cleaning solution, but is a wafer temperature during cleaning. Further, the unit indicating the ingredients for the cleaning solution (wt % or the like) represents the actual amount of the ingredients as an object.

Embodiment 1

An embodiment of this invention will be explained in detail with reference to the drawings.

This embodiment of the invention will be explained with reference to FIG. 1 to FIG. 7, for example, in a case of application of the invention to a fabrication method for a semiconductor device having a CMOS (Complementary MOS) circuit. A fabrication method according to this embodiment to be explained later is described in Japanese Patent Application No. 2000-127269 (filed on Apr. 27, 2000) filed by the present inventor.

FIG. 1 is a cross sectional view for a main portion of a semiconductor device during a fabrication step. At first, after forming a device isolation trench 2 of about 350 nm depth in a semiconductor substrate, including p-type single crystal silicon having a specific resistivity, for example, of about 1 to 10 Ωcm (hereinafter referred to as a substrate) 1 by using photolithography and dry etching, a silicon oxide film 3 is deposited on the substrate 1 including the inside of the trench by means of a CVD method. Successively, the surface of the silicon oxide film 3 above the trench is planarized by chemical mechanical polishing (CMP). Thus, a groove-shaped device isolation portion 2A (trench isolation) is formed. Then, boron is ion implanted to an nMOS forming region of the substrate 1 and phosphorus is ibn implanted to a pMOS forming region of the substrate 1, to form a p-well 4 in the nMOS forming region and an n-well 5 in the pMOS forming region.

Then, the substrate 1 is steam-oxidized to form a gate insulation film 6, for example, of about 6 nm thickness on the p-well 4 and the n-well 5. The thickness of the gate insulation film 6 herein means a thickness converted to that of silicon dioxide, which does not sometimes agree with the actual film thickness.

The gate insulation film 6 may be constituted with a silicon oxynitride film instead of the silicon oxide film. Since the silicon oxynitride film has a higher effect of suppressing the occurrence of the interface energy level or reducing electron traps in the film, compared with the silicon oxide film, it is possible to improve the hot carrier resistance and improve the insulation withstand property of the gate insulation film 6. The silicon oxynitride film can be formed, for example, by applying a heat treatment to the substrate 1 in a nitrogen gas-containing atmosphere, such as NO, $NO_2$ or $NH_3$. Further, the same effect as above can be obtained also by forming a gate insulation film 6 including silicon oxide to each of the surfaces of the p-well 4 and the n-well 5 and then applying a heat treatment to the substrate 1 in the nitrogen-containing gas atmosphere described above to segregate nitrogen to the interface between the gate insulation film 6 and the substrate 1.

Further, the gate insulation film 6 may be formed also, for example, with a composite insulation film comprising a silicon nitride film or a silicon oxide film and a silicon nitride film. If the thickness of the gate insulation film 6 including silicon oxide is reduced to less than 5 nm, and, more particularly, to less than 3 nm, as converted to the thickness of the silicon dioxide, a lowering of the insulation withstand voltage caused by the occurrence of direct tunnel current or hot carriers due to stresses becomes conspicuous. Since the silicon nitride film has a higher dielectric constant than the silicon oxide film, the thickness thereof converted to that of the silicon dioxide is decreased compared with the actual film thickness. That is, in a case having the silicon nitride film, even if it is physically thick, a capacitance equal with that of a relatively thin silicon dioxide film can be obtained. Accordingly, when the gate insulation film 6 is constituted with a single silicon nitride film or a composite film thereof with a silicon oxide film, since the effective film thickness can be increased more than that of the gate insulation film constituted with the silicon oxide film, reduction of the insulation withstand voltage caused by occurrence of the tunnel leakage current or the hot carriers can be improved. Further, since impurities penetrate less through the silicon oxynitride film compared with the silicon oxide film, when the gate insulation film 6 is constituted with the silicon oxynitride film, fluctuation of the threshold voltage caused by diffusion of impurities in the gate electrode material to the semiconductor substrate can be suppressed.

The film thickness of the single insulation film or a composite insulation film converted to that of silicon dioxide (hereinafter also simply referred to as converted film thickness) dr is a film thickness defined by the following equation:

$$dr = \sum \frac{\varepsilon i}{\varepsilon d} di$$

where $\varepsilon i$ is a specific dielectric constant of the insulation film as an object, di represents a film thickness and $\varepsilon s$ represents a specific dielectric constant of silicon dioxide.

For instance, the dielectric constant for silicon oxide ($SiO_2$) and silicon nitride ($Si_3N_4$) are, respectively, 4 to 4.2 and 8. Then, the thickness of the silicon nitride film, for example, of 6 nm thickness is calculated as 3 nm assuming the dielectric constant of silicon nitride is twice the dielectric constant of silicon oxide. That is, the capacitance is equal between the gate insulation film including the silicon nitride film of 6 nm thickness and the gate insulation film including the silicon oxide film of 3 nm thickness. Further, the capacitance of the gate insulation film formed of a composite film including a silicon oxide film of 2 nm thickness and a silicon nitride film of 2 run thickness (converted thickness equal 1 nm) is equal with the capacitance of a gate insulation film including a single silicon oxide film of 3 nm thickness.

Figure 2:
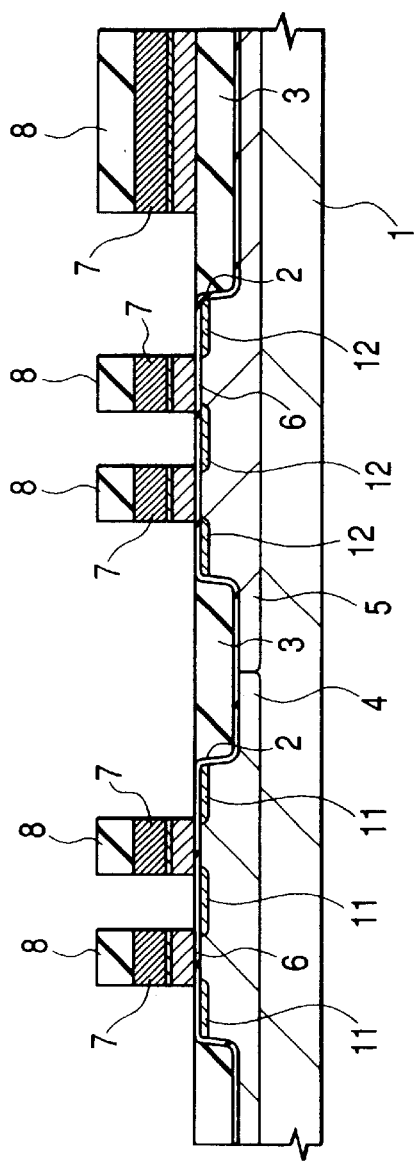
FIG. 2 is a cross sectional view of a main portion during a manufacturing step succeeding the step of FIG. 1.

Then, as shown in FIG. 2, a gate electrode 7 and a cap film 8 thereon are formed by usual photolithographic technique and dry etching over the gate insulation film 6. That is, after depositing, a low resistance polycrystal silicon film, a tungsten nitride (WN) film, a tungsten (W) film and the silicon nitride film successively from the lower layer over the substrate 1, for instance, a photoresist pattern is formed thereover so as to cover the gate electrode forming region while exposing other areas. Successively, using the photoresist pattern as an etching mask, the silicon nitride film, the tungsten film, the tungsten nitride film and the low resistance polycrystal silicon film exposed therefrom are removed, to form a gate electrode 7 of a so-called polymetal gate structure including a cap film 8 including a silicon nitride film, a low resistance polycrystal silicon film, a tungsten nitride film and a tungsten film. The low resistance polycrystal silicon film can be formed by a CVD method, and the tungsten nitride film and the tungsten film can be formed by a sputtering method. A titanium nitride (TiN) film may also be used instead of the tungsten nitride film. Further, a molybdenum (Mo) film may also be used instead of the tungsten film. Further, the gate electrode 7 may be formed of a lamination film prepared by depositing a tungsten silicide film, titanium silicide film or cobalt (Co) silicide film on the low resistance single crystal silicon film. Further, as the material for the gate electrode 7, an alloy of polycrystal or single crystal silicon (Si) or germanium (Ge) may also be used.

Then, in this embodiment, the following wafer-by-wafer cleaning treatment is applied, for example, to the substrate 1.

At first, a first wafer-by-wafer cleaning is employed as a cleaning treatment mainly for removing fine particles (organic material) deposited on the substrate 1. The fine particles are, for example, dust formed from semiconductor fabrication apparatus, jigs or human bodies or reaction products formed upon etching or film deposition treatment, and various materials are deposited in various forms on the substrate. In this case, the substrates 1 are cleaned wafer-by-wafer by using a mixed solution of ammonium hydroxide ($NH_4OH$), hydrogen peroxide ($H_2O_2$) and water ($H_2O$).

Following this, a second wafer-by-wafer cleaning is employed as a cleaning treatment mainly for removing metals deposited on the substrate. The metals are deposited from the semiconductor fabrication apparatus, atmospheric air, human bodies, solution chemicals or predetermined materials onto the substrate 1, and the mode of contamination can include, finely particulate-shaped deposition, tonic adsorption or implantation into the substrate 1 during the plasma process. In this embodiment, upon the second cleaning, a cleaning solution prepared by blending an etching solution having a performance capable of etching silicon, an oxide film or both of them, a pH controller and an oxidizer was used. Specifically, the cleaning treatment comprises, for example, hydrofluoric acid (HF: etching solution described above): hydrochloric acid (HCl: pH controller): hydrogen peroxide ($H_2O_2$: oxidizer): water ($H_2O$)=0.4:10:10:500. The treating is conducted, for example, at room temperature (about 23° C.). Further, the treating time is about 5 min at the longest. In this embodiment, it may be preferably about 1 min, specifically about 40 to 50 sec.

In the second wafer-by-wafer cleaning, in this embodiment, metals in the surface layer of the substrate 1 (silicon) can also be removed by carrying out oxidation on the surface of the substrate 1 (silicon) using hydrogen peroxide and etching the oxide film (silicon oxide film) using hydrofluoric acid to an extent of a monolayer simultaneously in one identical step. That is, since the cleaning power can be improved, it is possible to enhance the yield, the reliability and the performance of the semiconductor device.

Figure 3:
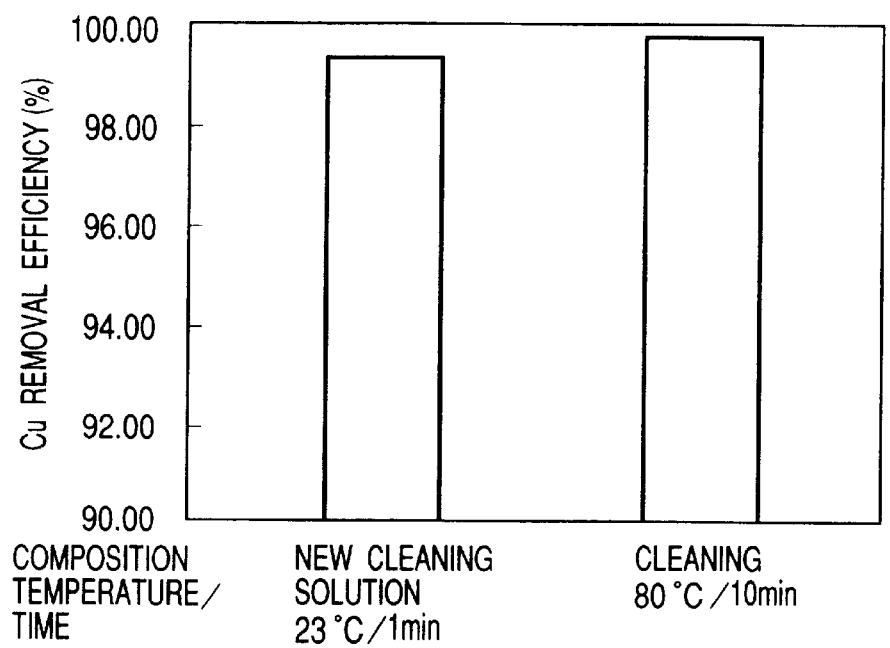
FIG. 3 is a graph showing the result of an experiment in which a comparison is made concerning the removal efficiency of copper (Cu) between a case of applying a cleaning method according to this embodiment and a case of applying a cleaning method studied by the present inventors in the course of accomplishing this invention.
Figure 4:
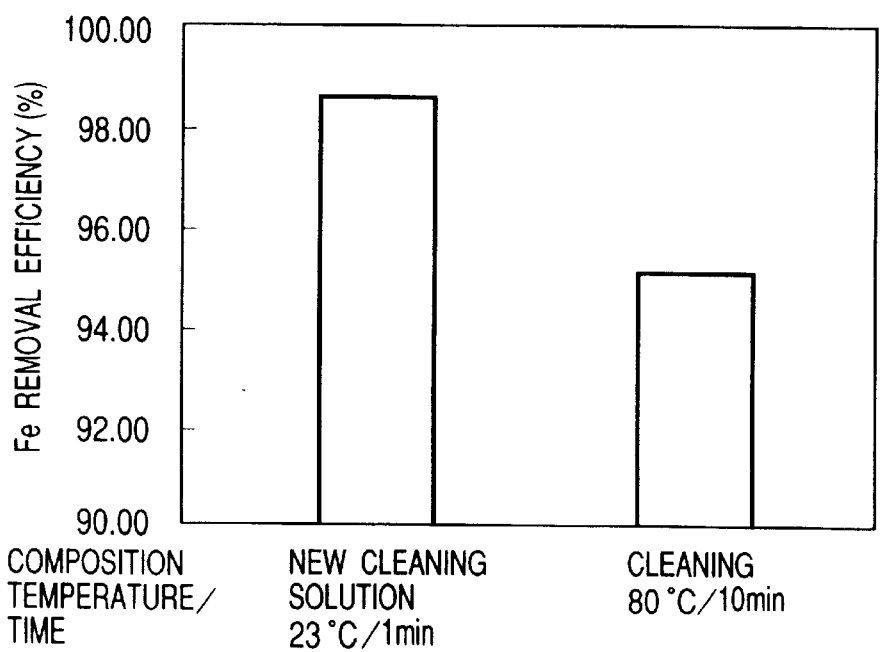
FIG. 4 is a graph showing the result of an experiment in which a comparison is made concerning the removal efficiency of iron (Fe) between a case of applying a cleaning method according to this embodiment and a case of applying a cleaning method studied by the present inventors in the course of accomplishing this invention.

FIG. 3 and FIG. 4 show the result of an experiment comparing the removal efficiency of copper (Cu) and iron (Fe) between a case of applying cleaning according to this embodiment and applying a cleaning method studied by the present inventors for accomplishing the invention. FIG. 3 shows copper removal efficiency and FIG. 4 shows iron removal efficiency. In each of the graphs, the left part illustrates this embodiment and the right part illustrates the cleaning technique studied by the present inventors. As seen from FIG. 3, when cleaning according to this embodiment is used, while the copper removal efficiency is somewhat lower compared with that of the cleaning method studied by the present inventors, a sufficient cleaning result can be obtained. Further, it can be seen from FIG. 4 that the iron removal efficiency is remarkably improved using the cleaning according to this embodiment in comparison to the cleaning method studied by the present inventors.

Further, in the cleaning treatment of this embodiment, since the metal contamination of the substrate 1 can be removed rapidly, the treating time for wafer-by-wafer cleaning can be shortened. Accordingly, even when wafer-by-wafer cleaning is employed, the development and production time for a semiconductor device can be shortened, thereby to improve the throughput in the fabrication steps for the semiconductor device.

Further, in the cleaning treatment according to this embodiment, the temperature for the cleaning can be lowered by the effect of fluorine, and cleaning can be conducted at room temperature or an even lower treating temperature. Accordingly, it is possible to reduce the electric power consumption of the cleaning apparatus. Further, the frequency for changing the chemical solutions during cleaning can be decreased. Further, since a heating facility is no longer required, the space required for installing the cleaning apparatus can be reduced. Further, since the heating facility is no longer required, the cost for the cleaning apparatus can be decreased. Accordingly, the fabrication cost for the semiconductor device can be decreased. Further, since the cleaning can be conducted at a lower temperature and in a short period of time, the oxidizing rate of tungsten constituting the gate electrode 7 can be retarded. That is, oxidation for a portion of the gate electrode 7 during cleaning can be reduced. Accordingly, it is possible to improve the yield, reliability and performance of the semiconductor device.

Further, in the cleaning treatment according to this embodiment, since the cleaning temperature can be lowered, the reaction rate between the oxidizer and the polymetal gate electrode (tungsten film or tungsten nitride film) can be lowered irrespective of the use of the oxidizer. Therefore, elimination of the gate electrode 7 by cleaning can be prevented. Accordingly, it is possible to improve the yield, reliability and performance of a semiconductor device having a polymetal gate electrode structure.

Further, in the cleaning treatment according to this embodiment, since the pH controller (strong acid) is contained in the cleaning solution, hydrogen ions are adsorbed on the surface of the substrate during cleaning, which can promote positive charging on the surface of the substrate 1 (silicon), so that re-deposition of positively charged metal ions, such as of copper, gold, aluminum, iron or nickel (for example, adsorption of copper on silicon to form silicide), can be suppressed or prevented. Accordingly, it is possible to improve the yield, reliability and performance of the semiconductor device.

For the etching solution, ammonium fluoride ($NH_4F$) or tetramethyl ammonium fluoride (TMAF) may also be used instead of hydrofluoric acid. Use of hydrofluoric acid can provide the effect of facilitating the use since the constitution is simple and a lot of data obtained through experience is available or use in carrying out the fabrication of a semiconductor device. However, in the use of hydrofluoric acid, since the etching rate for silicon dioxide films is high and excess etching is caused, the amount of hydrofluoric acid has to be decreased. Accordingly, preparation of the cleaning solution (chemical solution) is sometimes difficult when hydrofluoric acid is used. On the other hand, in the use of ammonium fluoride or trimethyl ammonium fluoride, the amount of $HF_2^-$ can be decreased even when the chemical is supplied in an amount identical with that of hydrofluoric acid. Accordingly, when ammonium fluoride or trimethyl ammonium fluoride is used, it can be supplied in a greater amount than that of hydrofluoric acid, so that preparation of the cleaning solution (chemical solution) can be facilitated. Further, for the pH controller, sulfuric acid ($H_2SO_4$) or nitric acid ($HNO_3$) may also be used instead of hydrochloric acid.

After the second cleaning, as described above, water washing is applied using, for example, pure water or super pure water on every sheet of substrates. Successively, drying is applied for each substrate sheet. In the drying, spin drying is applied, for example, in an inert gas atmosphere, such as an atmosphere of nitrogen or argon gas. That is, drying is applied in a low-oxygen atmosphere while rotating the substrate 1 in a direction parallel with a main plane thereof. This can suppress or prevent formation of water marks on the surface of the substrate 1. The drying method can be modified variously; and, for example, a method of steam drying in an isopropanol atmosphere, a hot blow drying or IR-ray drying method may also be used.

Figure 5:
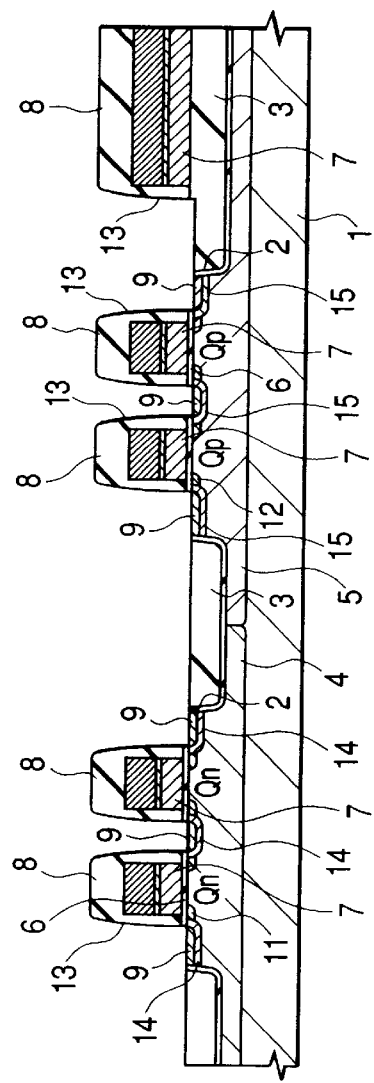
FIG. 5 is a cross sectional view of a main portion during a manufacturing step succeeding the step of FIG. 2.

After the wafer-by-wafer cleaning, as shown in FIG. 2, an $n^-$-semiconductor region 11 at low impurity concentration is formed in the p-well 4 by ion implanting, for example, phosphorus or arsenic, and a $p^-$-semiconductor region 12 at low impurity concentration is formed in the n-well 5 by ion implanting, for example, boron to the substrate 1, while using the gate electrode 7 as a mask. Successively, as shown in FIG. 5, an insulation film, for example, comprising a silicon nitride film, is deposited by a CVD method and etched anisotropically to form a side wall spacer 13 on the side wall of the gate electrode 7. Subsequently, an $n^+$-semiconductor region 14 (source and drain) at high impurity concentration is formed in the p-well 4 by ion implanting phosphorus or arsenic and a p-type semiconductor region 15 (source and drain) is formed to the n-type well by ion implanting boron or the like.

Then, a silicide layer 9 is formed on the surface of the n-type semiconductor region 14 (source and drain) and the surface of the $p^+$-type semiconductor region 15 (source and drain) by depositing a metal film, for example, of titanium or cobalt by a sputtering method and then removing the unreacted metal film after the heat treatment. An nMMOSQn and pMOSQp are completed up to this step.

Figure 6:
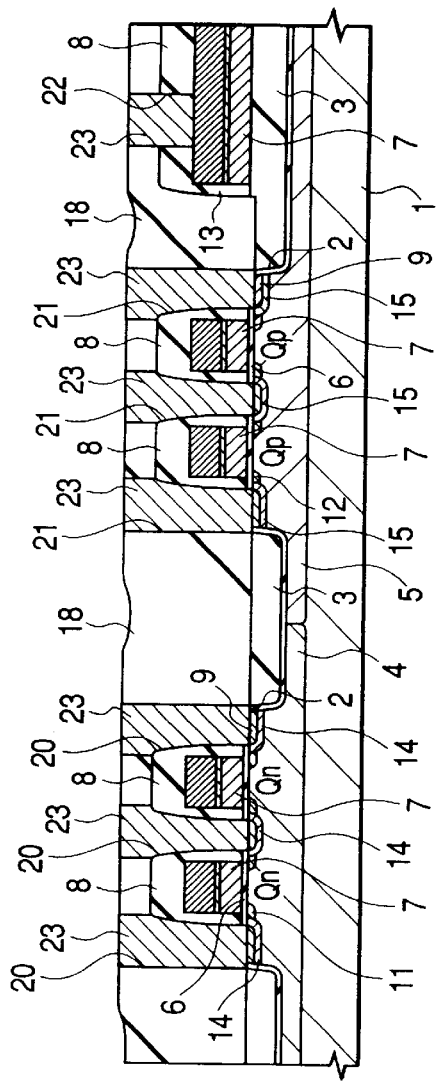
FIG. 6 is a cross sectional view of a main portion during a manufacturing step succeeding the step of FIG. 5.

Then, as shown in FIG. 6, an insulation film 18 comprising a silicon oxide film or the like is deposited on the substrate 1 by a CVD method; and, successively, the insulation film 18 is dry etched by using a photoresist film as a mask to form a contact hole 20 above the n$^+$-type semiconductor region 14 (source and drain) and a contact hole 21 above the p$^+$-type semiconductor region 15 (source and drain). Further, a contact hole 22 is formed also above the gate electrode 7. The insulation film 18 is constituted with a highly reflowing film capable of burying a narrow space of the gate electrodes 7, for example, a BPSG (Boron-doped Phospho Silicate Glass) film. Further, it may be constituted with an SOG (Spin On Glass) film formed by a spin coating method.

Then, a plug 23 is formed to the inside of each of the contact holes 20, 21 and 22. The plug 23 is formed, for example, by depositing a titanium nitride film, a tungsten film and the like by a CVD method on the upper portion of the insulation film 18 including the insides of the contact holes 20, 21 and 22 and then removing the unnecessary titanium nitride film and the tungsten film in the upper portion of the insulation film 18 by a chemical mechanical polishing (CMP) method or an etching back method so as to leave the films only in the inside of the contact holes 20, 21 and 22.

Figure 7:
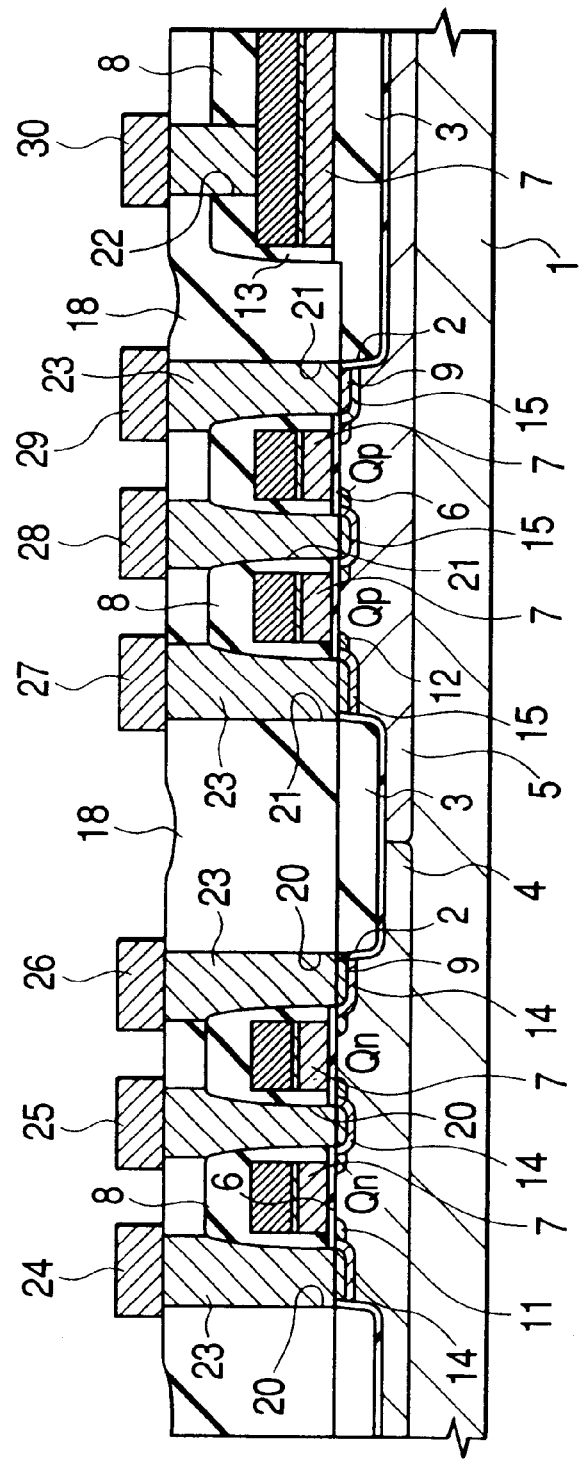
FIG. 7 is a cross sectional view of a main portion during a manufacturing step succeeding the step of FIG. 6.

Then, as shown in FIG. 7, first layer wirinas 24 to 30 including tungsten or the like are formed over the insulation film 18. The first layer wirings 24 to 30 are formed, for example, by depositing a tungsten film over the insulation film 18 by a sputtering method and then dry etching the tungsten film using a photoresist film as a mask. The first layer wirings 24 to 30 are electrically connected through the contact holes 20, 21 and 22 with the source and drain (n$^+$-semiconductor region) of a nMOSQn and source and drain (p$^+$-semiconductor region) of a pMOSQp, or the gate electrode 7. Subsequently, a semiconductor device is fabricated in accordance with an ordinary process for a semiconductor device having a CMOS circuit.

Figure 8:
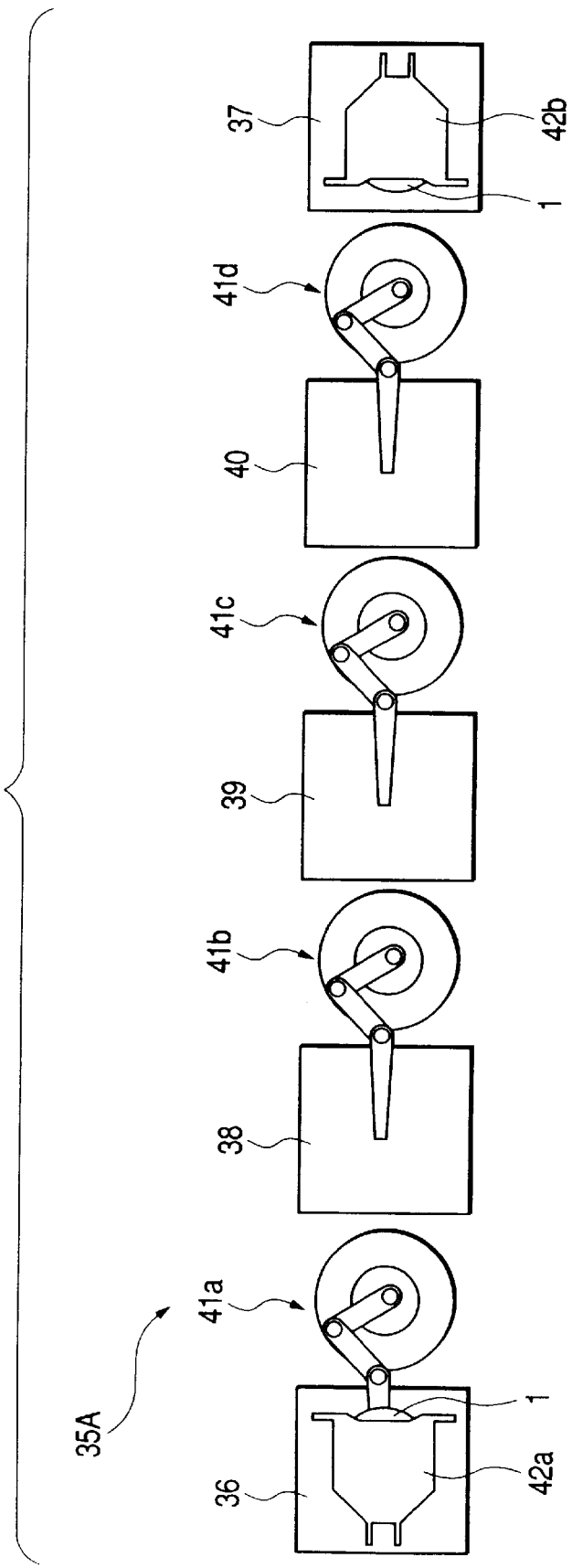
FIG. 8 is a diagram illustrating an example of a cleaning apparatus used in the fabrication of a semiconductor device representing an embodiment according to this invention.
Figure 9:
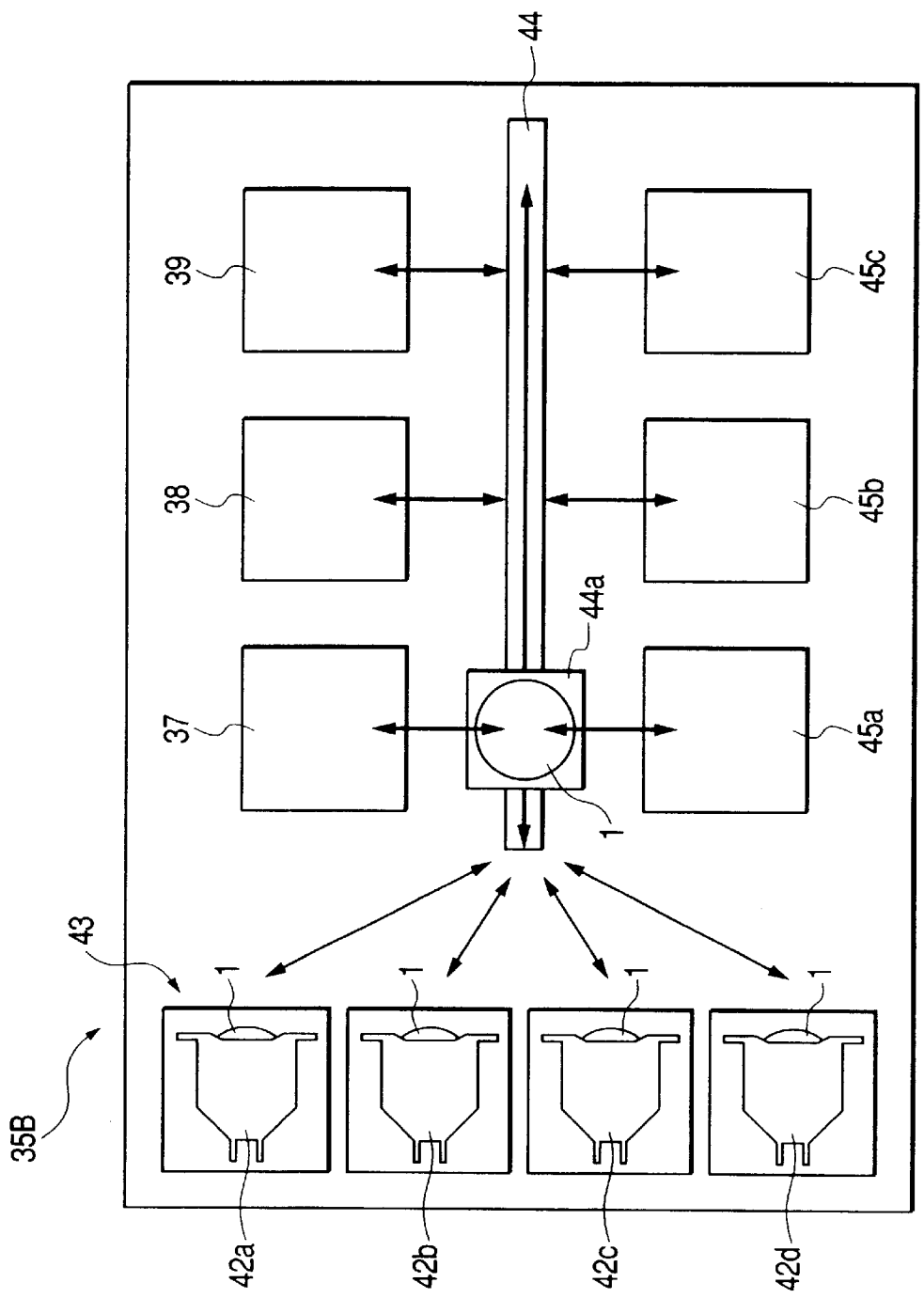
FIG. 9 is a diagram illustrating another example of a cleaning apparatus used in the fabrication of a semiconductor device representing an embodiment according to this invention.
Figure 10:
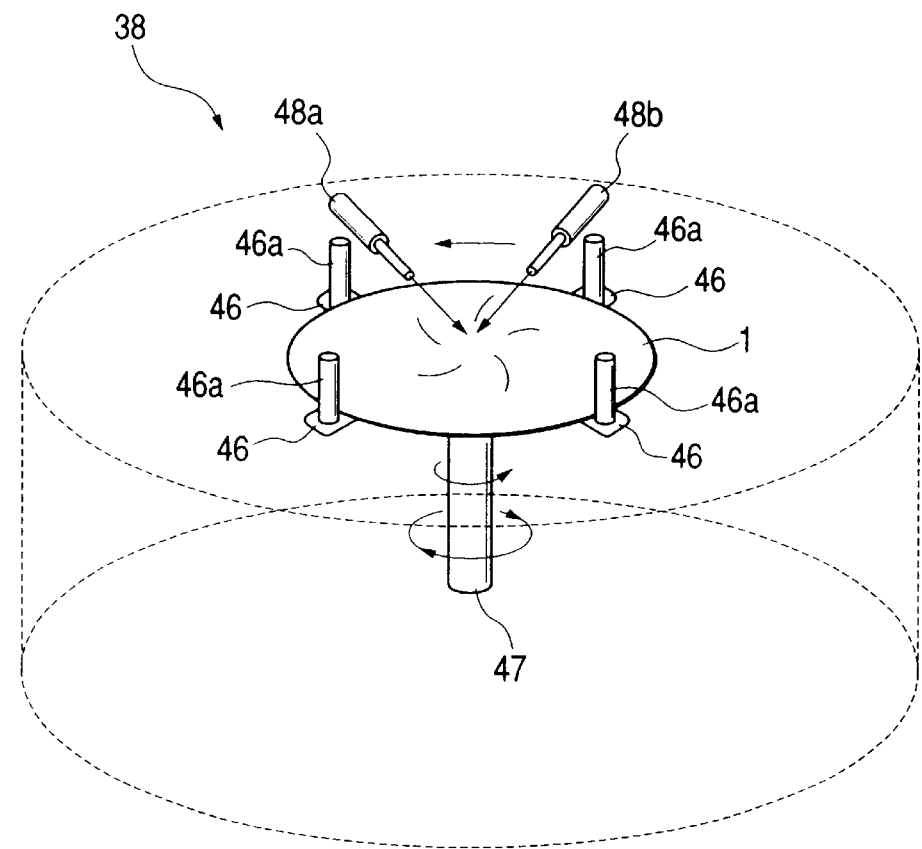
FIG. 10 is a diagrammatic perspective illustrating a cleaning section of the cleaning apparatus shown in FIG. 8 and FIG. 9.

FIG. 8 to FIG. 10 show examples of different types of cleaning apparatus for use in wafer-by-wafer cleaning. The constitution of the cleaning apparatus is not restricted only to the following description, but may be modified variously.

The cleaning apparatus 35A shown in FIG. 8 represents an example of a serial type cleaning apparatus. First to third cleaning sections 38 to 40 are disposed between a loader 36 and an unloader 37. Further, each of the transportation arms 41a–41d is disposed between respective sections. Wafer cassettes 42a are accommodated in the loader 36. The wafer cassette 42a accomodates a plurality of subtrates 1 (semiconductor wafers). The substrates 1 contained in the wafer cassette 42a in the loader 36 are taken out wafer-by-wafer by the transportation arm 41a and then transported to the first cleaning section 37.

In the first cleaning section 37, the first wafer-by-wafer cleaning described above is applied. The substrates 1, after completion of the first wafer-by-wafer cleaning, are taken out by the transportation arm 41b and transported to the second cleaning section 38 at the subsequent stage. In the second cleaning section 38, the second wafer-by-wafer cleaning is applied. That is, this is a cleaning treatment using the cleaning solution of this embodiment as described above. The substrates 1 after completion of the second wafer-by-wafer cleaning are taken out by the transportation arm 41c and transported to the third cleaning section 39 at the succeeding stage. In this stage, cleaning, for example, by hydrofluoric acid is possible. Each of the first to third cleaning section 37 to 39 has a structure capable of spin drying as described above. The substrates 1 after completion of the third wafer-by-wafer cleaning are taken out by the transportation arm 41d and accommodated in the cassette 42b in the unloader 37.

The cleaning apparatus 35B shown in FIG. 9 represents an example of a multi-chamber type cleaning apparatus. A plurality of wafer cassettes 42a to 42d are accommodated in a substrate entry/delivery section 43. Each of the wafer cassettes 42a to 42d can accommodate a plurality of substrates 1. At approximately at the center of the cleaning apparatus 35B, a transportation channel 44y is located, and first to third cleaning sections 37 to 39 and sections 45a to 45c are located on both right and left sides (upper and lower sides in the drawing) thereof. The sections 45a to 45c are, for example, film forming sections such as for forming the gate insulation film or forming the interlayer insulation film, and etching sections for patterning the conductor films or holes.

The substrate 1 accommodated in any of the wafer cassettes 42a to 42d is mounted on a transportation body 44a of the transportation channel 44 by a transportation arm or the like and then transported on the transport body 44a along the transportation channel 44 to the first to third cleaning sections 37 to 39 or sections 45a to 45c. The substrates 1, after completion of the predetermined treatment are transported along the transportation channel 44 in the same manner as described above and are transported to the succeeding first to third cleaning sections 37 to 39 or sections 45a to 45c. The transportation channel may be of a structure having a non-oxidative atmosphere, such as a nitrogen gas or argon gas. The substrates 1 after completion of the entire treatment are again carried along the transportation channel 44 to the substrate entry/delivery section 43 and then accommodated in a predetermined wafer cassette 42a to 42d by way of the transportation arm or the like. Since the cleaning apparatus 35B can conduct parallel treatment and can conduct cleaning treatment just after a predetermined treatment, the fabrication efficiency of the semiconductor device can be improved remarkably. Further, since the cleaning can be applied just after the predetermined treatment, deposition of obstacles can be reduced, thereby to improve the yield and the reliability of the semiconductor device.

FIG. 10 shows an example of a second cleaning section 38 for the cleaning apparatus 35A or 35B. A substrate 1 is mounted on supports 46. A stopper 46a is disposed at the top end of each support 46, by which the substrate 1 is supported. The support 46 are pivotally supported by a shaft 47 such that the assembly can rotate horizontally relative to the surface of the substrate 1 to be cleaned. Nozzles 48a and 48b are disposed above the substrate 1. The nozzle 48a is for supplying, for example, the cleaning solution of this embodiment to the surface of the substrate 1 to be cleaned. Further, the other nozzle 48b is for supplying pure water or super pure water to the surface of the substrate 1 to be cleaned. In the cleaning treatment, after mounting a sheet of substrate 1 on the supports 46a and then supplying a cleaning solution from the nozzle 48a to the surface of the substrate 1 to be cleaned, cleaning treatment is carried out while rotating the supports 46 in a plane horizontal to the surface of the substrate 1 to be cleaned. The water washing is conducted in the same manner. Further, the structure in the first cleaning apparatus 37 is substantially identical.

Embodiment 2

Figure 11:
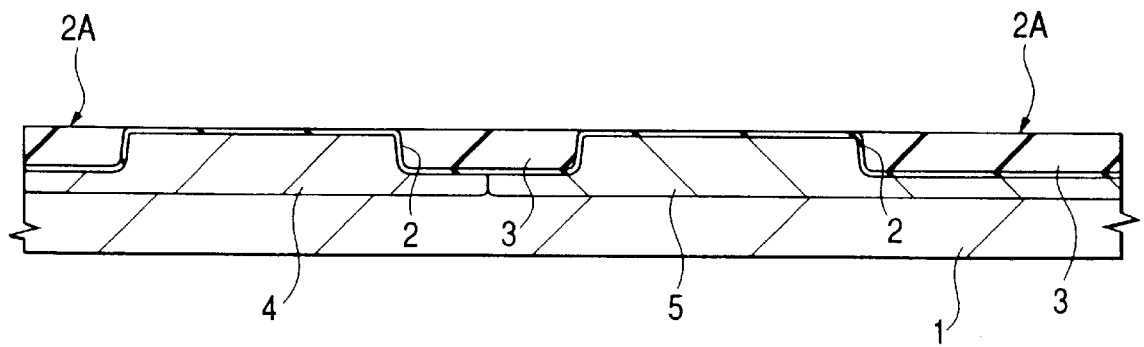
FIG. 11 is a cross sectional view of a main portion of a semiconductor device during a step in the fabrication another preferred embodiment according to this invention.

The fabrication method according to this embodiment will be explained with reference to FIG. 11 to FIG. 18. At first, as shown in FIG. 11, after forming a device isolation trench 2 on the main surface of a substrate 1 (since the substrate is transported to each of the steps and treated in the form of a wafer, it is sometimes referred to also as a wafer) including p-type single crystal silicon, a p-well 4 is formed in a portion of the substrate 1 and an n-well 5 is formed in another portion. The steps so far are identical to those of the Embodiment described above.

Figure 12:
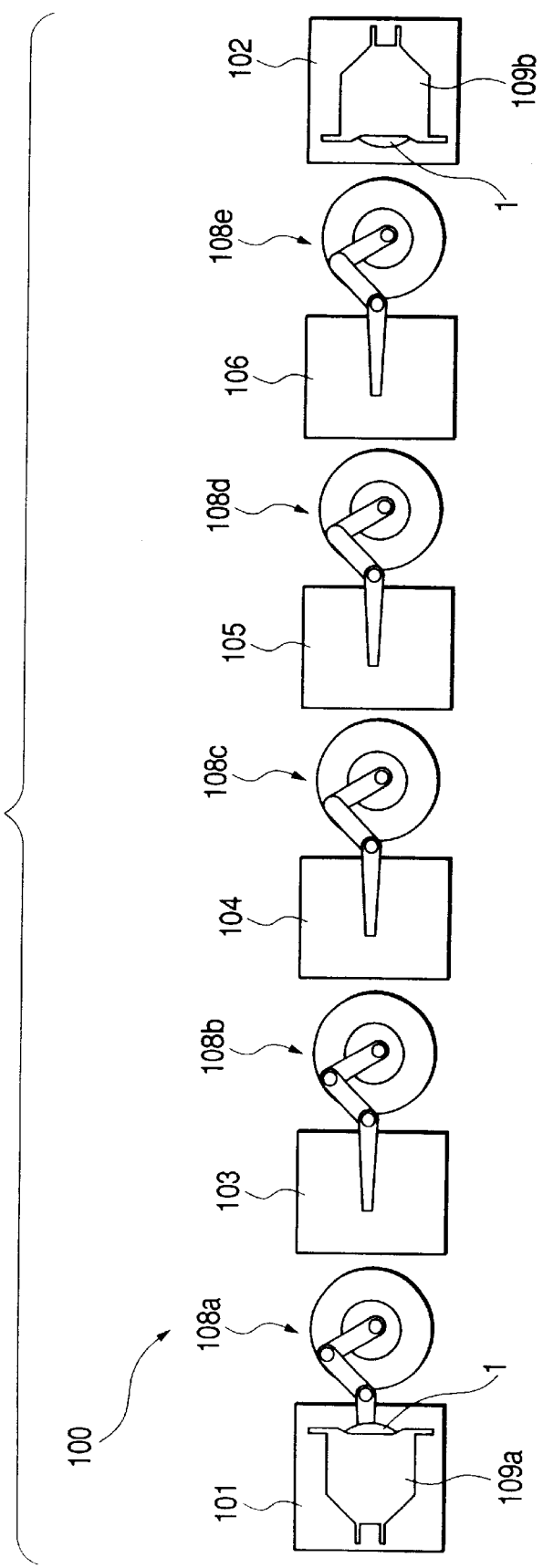
FIG. 12 is a diagram illustrating a cleaning apparatus used in the fabrication of a semiconductor device representing another preferred embodiment according to this invention.

Then, the surface of the substrate 1 is cleaned. This cleaning is conducted for forming a clean gate insulation film on the surface of the p-well 4 and on the surface of the n-well 5. FIG. 12 is a schematic view illustrating a serial type wafer-by-wafer cleaning apparatus 100 used in the cleaning step. First to third cleaning sections 103, 104 and 105, and a drying section 106 are disposed in this order between a loader 101 and an unloader 102 of the wafer-by-wafer cleaning apparatus 100. Further, each of the transportation arms 108a to 108e for transporting the wafers (substrates) 1 are disposed between each of the sections (103 to 106). A plurality of wafers 1, each formed with the p-well 4 and the n-well 5, are introduced, while being accommodated in a wafer cassette 109a, into the loader 101. The wafers 1 are taken out one by one by the transportation arm 108a from the wafer cassette 109a and then transported to the first cleaning section 103.

In the first cleaning section 103, the surface of the wafer 1 is cleaned so as to remove obstacles by using a well-known SC-1 solution (APM solution) including a mixed solution of ammonium hydroxide ($NH_4OH$), hydrogen peroxide ($H_2O_2$) and water ($H_2O$).

Figure 13:
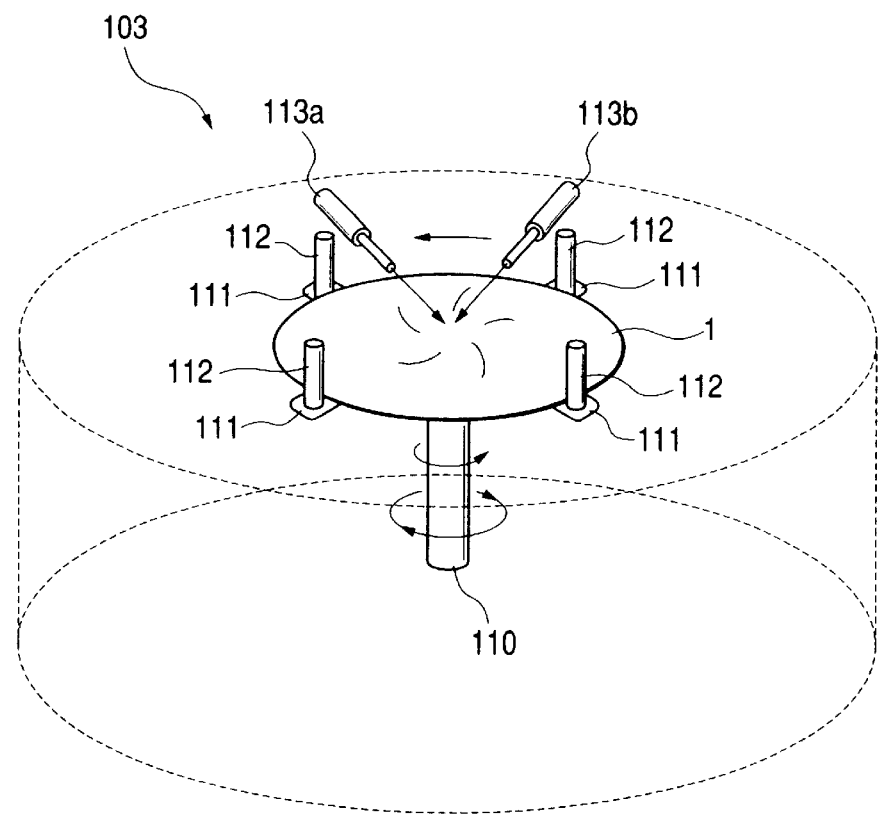
FIG. 13 is a diagrammatic perspective view illustrating a cleaning section of the cleaning apparatus shown in FIG. 12.

FIG. 13 is a schematic view illustrating the inner structure of a cleaning section 103. A wafer 1 is placed, with the main surface thereof facing up, over four supports 111 each connected to the upper end of a shaft 110, which is rotatable for rotating the supports 111 in a horizontal plane, and the wafer 1 is held and secured by stoppers 112 disposed on the supports 111.

In the cleaning section 103, the SC-1 solution and pure water are supplied to the surface of the wafer 1 by a spraying method. That is, two nozzles 113a and 113b are disposed above the wafer 1, which has been placed on the supports 111, and the SC-1 solution is supplied from one of them (nozzle 113a) to the surface of the rotating wafer 1. The cleaning is applied while setting the temperature of the wafer 1 to about 80° C. and for a treating time of about 10 to 20 min. In the cleaning treatment by the spraying method, different from the method of dipping the wafer 1 in the cleaning solution, since the temperature of the cleaning solution discharged from the nozzle 113a is lowered as the solution travels to the surface of the wafer 1, the cleaning solution has to be heated to a temperature higher than 80° C. in order to keep the temperature of the wafer 1 at 80° C. during cleaning.

When the cleaning with the SC-1 solution is completed, pure water is supplied from the other nozzle 113b to the surface of the rotating wafer 1 and rinsing is applied for removing the SC-1 solution. Further, the inner structure of the second cleaning section 104 and the third cleaning section 105 is constituted substantially identical with that of the first cleaning section 103.

Then, the wafer 1 is transported by the transportation arm 108b from the first cleaning section 103 to the second cleaning section 104. A new wafer 1 is transported from the wafer cassette 109a to the first cleaning section 103 by way of the transportation arm 108a and cleaning with the SC-1 solution as described above is carried out.

Figure 14:
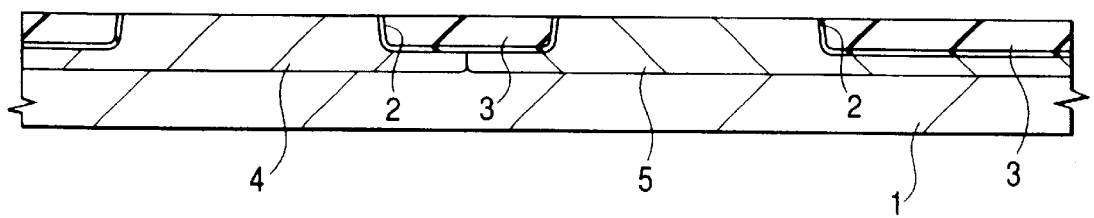
FIG. 14 is a cross sectional view of a main portion during a manufacturing step succeeding the step of FIG. 11.

The wafer transported to the second cleaning section 104 is subjected to cleaning at room temperature for several tens of second by using well-known hydrofluoric acid (HF: water=1:99). As shown in FIG. 14, the silicon oxide film 4 on the surface of the wafer 1 is wet-etched by conducting the cleaning treatment and the surface of the p-well 4 and the surface of the n-well 5 are exposed.

Then, the wafer 1, after being subjected to rinsing treatment with pure water, is transported from the second cleaning section 104 to the third cleaning section 105 by a transportation arm 108c. In the third cleaning section 105, a cleaning treatment is conducted for removing metals, such as Cu deposited on the surface of the p-well 4 and the surface of the n-well 5 exposed by the hydrofluoric acid cleaning.

The cleaning solution used in this embodiment is an aqueous solution containing 0.1 to 15% by weight of hydrochloric acid, 0.01 at 0.3% by weight of hydrofluoric acid and 0.1 to 15% by weight of hydrogen peroxide. The concentration of hydrochloric acid, hydrofluoric acid and hydrogen peroxide are, preferably, 0.3 to 5% by weight, 0.02 to 0.2% by weight and 0.3 to 5% by weight, preferably, and, more preferably, 0.5 to 3% by weight, 0.03 to 0.1% by weight and 0.5 to 3% by weight, respectively. If the concentration of hydrofluoric acid is less than the lower limit of the range described above (0.01% by weight), no removal effect for metal contamination can be obtained. On the other hand, if the upper limit of the concentration of hydrofluoric acid exceeds the upper limit of the above range (0.3% by weight), the etching amount of the substrate 1 is increased leading to problems, such as lowering of the surface flatness. Accordingly, it is important to lower the concentration of the added hydrofluoric acid.

The cleaning solution in this embodiment has a composition in which a slight amount of hydrofluoric acid is added to the well-known SC-2 solution (HPM solution) being used with an aim of removing metal contamination. Since the cleaning solution contains highly electron attractive F (fluorine), metals are easily dissolved in the cleaning solution and hydrofluoric acid added in a slight amount slightly etches the surface of the substrate 1, so that it is capable of removing metals taken to the surface of the substrate 1 at a low temperature and in a short period of time. Further, since hydrogen ions derived from hydrochloric acid are adsorbed to the surface of the wafer 1 to promote positive (+) charging, re-deposition of metal ions detached from the surface of the wafer 1 can also be suppressed.

The cleaning solution in this embodiment can be used within a range of temperatures of about from 15° C. to 40° C. with no requirement for elevating the temperature upon use, and an appropriate temperature range is usually about from 16° C. to 35° C. and, preferably, about 18° C. to 28° C. The treating time is within the temperature range is about 5 min at the longest and usually a range from 50 sec to 2 min may suffice.

Since metal contamination on the surface of the wafer 1 can be removed efficiently by using the cleaning solution in this embodiment, the quality of the gate insulation film formed after the cleaning step can be improved.

Further, since it is not necessary to elevate the temperature of the cleaning solution in this embodiment upon use, it can provide effects such that (1) the electric power consumption of the wafer-by-wafer cleaning apparatus 100 can be reduced, (2) the size of the wafer-by-wafer cleaning apparatus 100 can be decreased by so much that the heating facility becomes unnecessary, and (3) the exchanging frequency of the cleaning solution is decreased since the composition thereof fluctuates less; and so, it is possible, to reduce the operation cost of the wafer-by-wafer cleaning apparatus 100.

Further, since the cleaning time can be shortened remarkably compared with the case of using the SC-2 solution, it is possible to improve the throughput of the cleaning step in the wafer-by-wafer treatment.

Then, after rinsing with pure water, the wafer 1 is transported from the third cleaning section 105 to the drying section 105 by the transportation arm 108d. In the drying section 106, the water content on the surface is removed by rotating the wafer 1 at a high speed. An inert gas, such as a nitrogen or Ar (argon) gas, is supplied to fill the inside of the drying section 106 to prevent formation of water marks on the surface of the wafer 1. As a method for drying treatment, a method of steam drying in an isopropanel atmosphere or a method of drying using hot blow or IR-rays may also be used in addition to the spin drying method described above.

The wafer 1, after completion of the drying, is taken out by the transportation arm 108e from the drying section 106, accommodated in the wafer cassette 109b in the unloader 102 and then transported to the next step. As described above, wafers are subjected to cleaning treatment wafer-by-wafer and obstacles or metal contaminations on the surface are removed.

Figure 15:
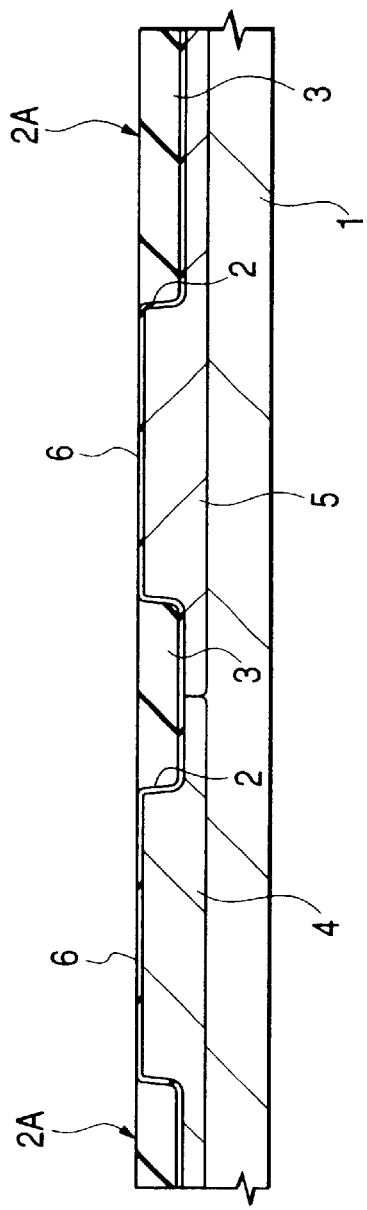
FIG. 15 is a cross sectional view of a main portion during a manufacturing step succeeding the step of FIG. 14.

Then, as shown in FIG. 15, a substrate 1 is thermally oxidized to form a gate insulation film 6 including a silicon oxide film of about 6 nm thickness on the surface of the p-well 4 and the surface of the n-well 5. The gate insulation film 6 may be constituted with a silicon oxynitride film instead of the silicon oxide film. Further, it may be constituted with an insulation film, such as a silicon nitride film, a composite insulation film of a silicon oxide film and a silicon nitride film or a tantalum oxide film, which has higher dielectric constant than the silicon oxide film.

Figure 16:
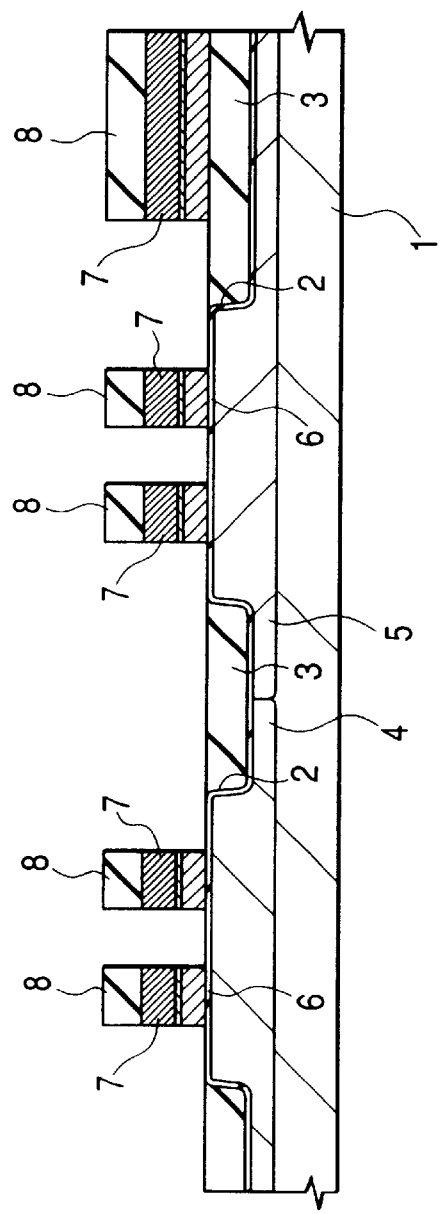
FIG. 16 is a cross sectional view of a main portion during a manufacturing step succeeding the step of FIG. 15.

Then, as shown in FIG. 16, a gate electrode 7 having a gate length of about 0.13 $\mu$m to 0.14 $\mu$m is formed above the gate insulation film 6. The gate insulation film 7 is formed by depositing a polycrystal silicon film of about 100 nm thickness doped with an n-impurity such as phosphorus over the gate insulation film 6 by a CVD method, successively, depositing a WN (tungsten nitride) film of about 5 nm thickness and a W film of about 50 nm thickness by a sputtering method thereover and, further, depositing a silicon nitride film 9 of about 100 nm thickness thereover by the CVD method and then patterning the films by dry etching using a photoresist film as a mask. Further, gate electrode 7 may also be constituted with a laminate film formed of a polycrystal silicon film, a WN film and Mo film by using an Mo (molybdenum) film instead of the W film.

Metal, such as W, as a portion of the gate electrode material is deposited on the surface of the substrate 1 formed with the gate electrode 7. The metal deposited on the surface of the substrate 1 diffuses into the gate insulation film 6 or into the substrate 1 by a subsequent heat treatment, such as oxidation, to bring about degradation of the device characteristics, such as deterioration of the insulation withstand voltage of the gate insulation film 6, fluctuation of the gate insulation film/substrate interface energy level and pn-junction destruction. In view of the above, after removing the photoresist film, which was used as the pattern for the gate electrode 7, by an ashing treatment, a cleaning treatment is applied for removing metals or obstacles that remain on the surface of the silicon substrate 1.

In this cleaning step, it is required to reliably remove metal contamination while suppressing etching (scraping) of the gate insulation film 6 or the substrate 1 as much as possible. Particularly, in a process of forming the gate electrode 7 having a fine gate length of about 0.13 $\mu$m to 0.14 $\mu$m as in this embodiment, when the gate insulation film 6 below the side wall of the gate electrode 7 is isotropically etched to form under-cuts, deterioration of characteristics, such as lowering of the withstand voltage of the gate insulation film 6, tends to result. Accordingly, it is not preferred to use a cleaning solution containing hydrofluoric acid at a high concentration in this cleaning step.

Further, in a case where the gate electrode 7 comprises a polymetal structure as in this embodiment, it is required to surely remove metal contamination without dissolving or eliminating metals constituting the gate electrode 7. Accordingly, it is not preferred to use the SC-2 solution for conducting a treatment at high temperature for a long time such as at 80° C. for 10 min, in this cleaning step.

Therefore, in this cleaning step, the cleaning solution according to this invention, including an aqueous solution containing 0.1 to 15% by weight of hydrochloric acid, 0.01 to 0.3% by weight of hydrofluoric acid and 0.1 to 15% by weight of hydrogen peroxide used in the step of forming the gate insulation film 6 is used. Also in this case, the concentration of the hydrochloric acid, hydrofluoric acid and hydrogen peroxide are 0.3 to 5% by weight, 0.02 to 0.2% by weight and 0.3 to 5% by weight, respectively, and, more preferably, 0.5 to 3% by weight, 0.03 to 0.1% by weight and 0.5 to 3% by weight, respectively.

Specifically, the cleaning apparatus 35A shown in FIG. 8, the cleaning apparatus 35B shown in FIG. 9 or the wafer-by-wafer cleaning apparatus 100 shown in FIG. 12 is used, and obstacles at the surface of the wafer 1 are removed by using the SC-1 solution (APM solution) including a mixed solution of ammonium hydroxide ($NH_4OH$), hydrogen peroxide ($H_2O_2$) and water ($H_2O$). The temperature for the wafer 1 is set to about 80° C. and the treating time is set to about 10 to 20 min.

Then, after rinsing the wafer 1 with pure water, the surface of the wafer 1 is cleaned by using the cleaning solution according to this invention. Also, in this case, it is not necessary to elevate the temperature of the cleaning solution according to this invention upon use and it can be used within a temperature range of about from 15° C. to 45° C. An appropriate temperature range is usually about from 16° C. to 35° C. and, preferably, about from 18° C. to 28° C. Further, the treating time within the temperature range is about 5 min at the longest, and, usually, a range from 50 sec to 2 min may suffice.

Then, after rinsing the wafer 1 with pure water and then removing the water content on the surface by drying as described above, the wafer 1 is transported to the succeeding step. Subsequent steps are identical with those in Embodiment 1.

Since the cleaning solution in this embodiment contains highly electron attractive F (fluorine), metals are easily dissolved in the cleaning solution and hydrofluoric acid added in a slight amount slightly etches the surface of the gate insulating film 6 and the surface of the substrate 1; therefore, it is capable of removing metals taken into the surface of the gate insulating film 6 and the surface of the substrate 1 at a low temperature in a short period of time. Further, since the hydiofluoric acid concentration is low, the gate insulation film 6 or the substrate 1 is not etched unnecessarily.

Further, since the cleaning solution in this embodiment contains hydrogen peroxide, which tends to easily ionize W constituting the portion of the gate electrode scraping of the W film can be minimized because the treatment can be applied at low temperature in a short period of time, while cleaning at high temperature for long time would scrape or eliminate a portion of the gate electrode 7 (W film).

Figure 17:
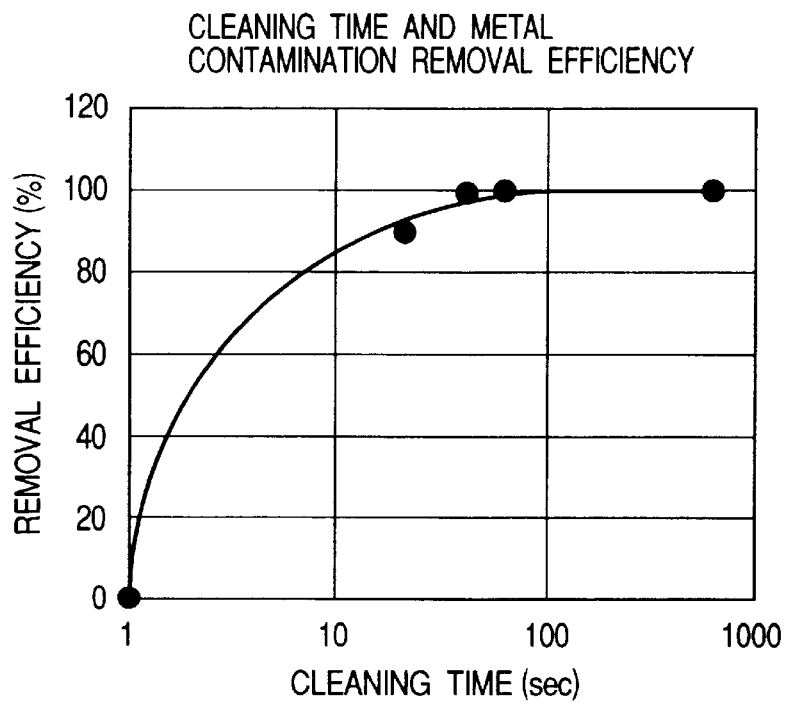
FIG. 17 is a graph illustrating a relation between cleaning time and metal contamination removal efficiency in an experiment using the cleaning solution of this invention.

FIG. 17 shows a relation between the cleaning time and the metal contamination removal efficiency as a result of an experiment using the cleaning solution according to this invention. The experiment was conducted at a treating temperature of 23° C. It can be seen from the result that the cleaning solution according to this invention can effectively remove metal contamination at a low temperature and in a short period of time.

Figure 18:
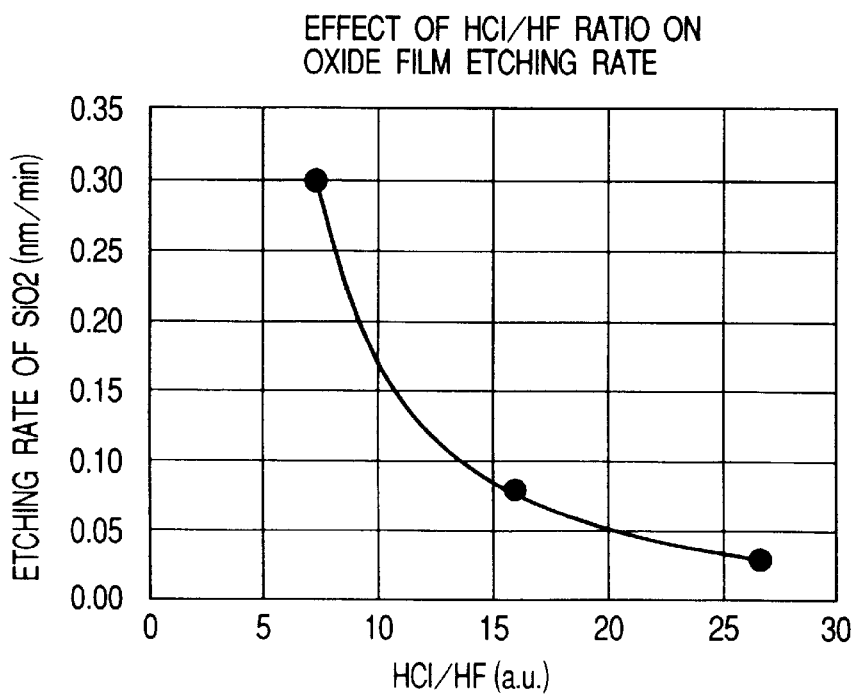
FIG. 18 is a graph illustrating the result of an experiment for measuring the effect of the ratio of hydrochloric acid to hydrofluoric acid contained in the cleaning solution according to this invention on the etching rate of a silicon oxide film.

FIG. 18 shows the result of an experiment measuring the effect of the hydrochloric acid to hydrofluoric acid ratio on the etching rate of the silicon oxide film. It can be seen from the result that the etching rate of the silicon oxide film is lowered as the hydrochloric acid to hydrofluoric acid ratio is lowered. Accordingly, it is preferred to use the cleaning solution while lowering the hydrochloric acid to hydrofluoric acid ratio in the cleaning, step, for example, the cleaning step after forming the gate electrode 7, where removal of metal contamination is required, while suppressing etching of the silicon oxide film (gate insulation film) as much as possible. A practical range of use is hydrochloric acid: hydrofluoric acid=about 5 to 1500:1 (weight ratio) and, preferably, hydrochloric acid: hydrofluoric acid=5 to 1000:1 (weight ratio) and, more preferably, hydrochloric acid: hydrofluoric acid=10 to 30:1 (weight ratio).

As described above, by using the cleaning solution according to this embodiment, metal contamination can be removed reliably while suppressing the etching (scraping) of the gate insulation film 6 or the substrate 1 to the utmost.

Further, since it is possible to surely remove metal contamination while suppressing etching (scraping) of the W film constituting the gate electrode 7 to the utmost, a fabrication margin for the gate electrode 7 can be decreased to effectively enhance the refinement of devices.

Further, when the cleaning solution according to this invention that is capable of effectively removing metal contamination at a low temperature in a short period of time is used, it is possible to reduce the operation cost of the cleaning apparatus, improve the throughput of the cleaning step and forward the wafer-by-wafer treatment.

The invention made by the present inventor has been described concretely with reference to the embodiments as described above, but the invention is not limited only to the preferred embodiments, and it will be apparent that various modifications are possible within a scope not departing the purpose thereof.

In the description of the preferred embodiments presented above, reference has been made to cleaning treatment before forming a gate insulation film and cleaning treatment after forming a gate electrode, but the cleaning solution according to this invention is applicable generally to cleaning steps for removing metal contamination. Further, this invention is applicable not only to cleaning of a wafer surface, but also to the cleaning of the wafer back face.

While the foregoing description of the present invention has been directed to a case of applying the invention mainly to a method of fabrication of a semiconductor device having CMOS circuits as the preferred application constituting the background thereof, the invention is not restricted only thereto and various applications are possible. For example, the invention is applicable also to a fabrication method for a semiconductor device having memory circuits, such as a DRAM (Dynamic Random Access Memory), SPAM (Static Random Access memory) or flash memory (EEPROM: Electric Erasable Programmable Read Only Memory), a fabrication method for a semiconductor device having logic circuits, such as microprocessors, and a fabrication method of the mixed mount type where a memory circuit and a logic circuit are disposed on one identical semiconductor substrate. Further, the invention is applicable also to a fabrication method for liquid crystal substrates.

The effect obtained by representative aspects and features of the present invention as disclosed in the present application will be explained briefly. Metal contamination can be removed at a low temperature in a short period of time by using an aqueous solution containing 0.1 to 15% by weight of hydrochloric acid, 0.01 to 0.3% by weight of hydrofluoric acid and 0.1 to 15% by weight of hydrogen peroxide as a cleaning solution for cleaning a semiconductor substrate.

What is claimed is:

1. A semiconductor integrated circuit device fabrication method, using a wafer having a silicon material region and a Polymetal gate electrode having a lower silicon layer and an upper metal layer, comprising the step of cleaning a main surface of the wafer at a temperature of 15 to 40 degrees centigrade by using an aqueous solution containing 0.1 to 15% by weight of hydrochloric acid, 0.01 to 0.3% by weight of hydrofluoric acid and 0.1 to 15% by weight of hydrogen peroxide, wherein the cleaning time for the wafer is 2 minutes or less.

2. A semiconductor integrated circuit device fabrication method according to claim 1, wherein the cleaning time for the wafer is 50 seconds or less.

3. A semiconductor integrated circuit device fabrication method according to claim 1, wherein the ratio of hydrochloric acid to hydrofluoric acid contained in the aqueous solution is: hydrochloric acid: hydrofluoric acid=5 to 1500:1 (by weight ratio).

4. A semiconductor integrated circuit device fabrication method according to claim 3, wherein the ratio of hydrochloric acid to hydrofluoric acid contained in the aqueous solution is: hydrochloric acid: hydrofluoric acid=5 to 1000:1 (by weight ratio).

5. A semiconductor integrated circuit device fabrication method according to claim 4, wherein the ratio of hydrochloric acid to hydrofluoric acid contained in the aqueous solution is: hydrochloric acid: hydrofluoric acid=10 to 30:1 (by weight ratio).

6. A semiconductor integrated circuit device fabrication method according to claim 1 wherein the aqueous solution contains at most 5% by weight of hydrochloric acid, at most 0.2% by weight of hydrofluoric acid and at most 5% by weight of hydrogen peroxide.

7. A semiconductor integrated circuit device fabrication method according to claim 1, wherein the cleaning temperature for the semiconductor wafer is from 16 to 35° C.

8. A semiconductor integrated circuit device fabrication method according to claim 7, wherein the cleaning temperature for the semiconductor wafer is from 18 to 28° C.

9. A semiconductor integrated circuit device fabrication method according to claim 1, wherein the aqueous solution contains at most 3% by weight of hydrochloric acid, at most 0.1% by weight of hydrofluoric acid and at most 3% by weight of hydrogen peroxide.

10. A semiconductor integrated circuit device fabrication method, using a wafer having a silicon material region, comprising the steps of:
   (a) depositing a metal film over a silicon film over a main surface of a wafer,
   (b) patterning the conductive film and,
   (c) cleaning the main surface of the wafer at a temperature of 15 to 40° C. by using an aqueous solution containing 0.1 to 15% by weight of hydrochloric acid, 0.01 to 0.3% by weight of hydrofluoric acid and 0.1 to 15% by weight of hydrogen peroxide after the step (b), wherein the cleaning time for the wafer is 2 minutes or less.

11. A semiconductor integrated circuit device fabrication method according to claim 10, wherein the metal film is a W or Mo film.

12. A semiconductor integrated circuit device fabrication method according to claim 10, wherein the step of patterning the metal film and the silicon film is a step of forming the gate electrode of an MISFET.

13. A semiconductor integrated circuit device fabrication method according to claim 12, which further comprises, after the step (c)

(d) cleaning the main surface of the wafer with pure water, and (e) drying the main surface of the wafer after the step (d).

14. A semiconductor integrated circuit device fabrication method according to claim 13, which further comprises, after the step (e), the steps of:

(f) forming source and drain of an MISFET to the wafer on both sides of the gate electrode, (g) forming, after the step (f), an insulation film over the gate electrode, (h) forming a contact hole for exposing the surface of the source and drain by etching the insulation film, (i) cleaning the inside of the contact hole by using the aqueous solution of the same composition as that for the aqueous solution described above and (j) forming, after the step (i), metal wirings electrically connected with the source and drain through the contact hole in the insulation film.

15. A semiconductor integrated circuit device fabrication method according to claim 10, wherein the aqueous solution contains 0.3 to 5% by weight of hydrochloric acid, 0.02 to 0.2% by weight of hydrofluoric acid and 0.3 to 5% by weight of hydrogen peroxide.

16. A semiconductor integrated circuit device fabrication method according to claim 15, wherein the aqueous solution contains 0.5 to 3% by weight of hydrochloric acid, 0.03 to 0.1% by weight of hydrofluoric acid and 0.5 to 3% by weight of hydrogen peroxide.

17. A semiconductor integrated circuit device fabrication method according to claim 10, wherein the ratio of hydrochloric acid to hydrofluoric acid contained in the aqueous solution is hydrochloric acid: hydrofluoric acid=5 to 1500:1 (by weight ratio).

18. A semiconductor integrated circuit device fabrication method according to claim 17, wherein the ratio of hydrochloric acid to hydrofluoric acid contained in the aqueous solution is hydrochloric acid: hydrofluoric acid=5 to 1000:1 (by weight ratio).

19. A semiconductor integrated circuit device fabrication method according to claim 18, wherein the ratio of hydrochloric acid to hydrofluoric acid contained in the aqueous solution is hydrochloric acid: hydrofluoric acid=10 to 30:1 (by weight ratio).

20. A semiconductor integrated circuit device fabrication method according to claim 10, wherein the cleaning temperature for the wafer is from 16 to 35° C.

21. A semiconductor integrated circuit device fabrication method according to claim 20, wherein the cleaning temperature for the wafer is from 18 to 28° C.

22. A semiconductor integrated circuit device fabrication method according to claim 10, wherein the cleaning time for the wafer is 50 seconds or less.

* * * * *